United States Patent [19]

Lake

[11] 4,132,871
[45] Jan. 2, 1979

[54] DIGITALLY SYNTHESIZED MULTI-FREQUENCY SIGNAL GENERATOR

[75] Inventor: Don W. Lake, Cupertino, Calif.

[73] Assignee: Fairchild Camera and Instrument Corporation, Mountain View, Calif.

[21] Appl. No.: 808,937

[22] Filed: Jun. 22, 1977

[51] Int. Cl.² .............................................. H04M 1/50
[52] U.S. Cl. .................................. 179/84 VF; 328/14
[58] Field of Search ........................ 179/84 VF, 90 K; 328/14; 331/48, 56, 117R; 340/347 M, 365 S

[56] References Cited

U.S. PATENT DOCUMENTS

| | | | |
|---|---|---|---|
| 4,007,459 | 2/1977 | Hagelbarger | 179/90 K |
| 4,017,693 | 4/1977 | Roche et al. | 179/90 K |

*Primary Examiner*—Kathleen H. Claffy
*Assistant Examiner*—Joseph A. Popek

*Attorney, Agent, or Firm*—Alan H. MacPherson; Henry K. Woodward; Paul J. Winters

[57] ABSTRACT

A solid state signal generator for producing frequency combinations such as used in multi-tone telephone systems. The output of a crystal oscillator is divided to obtain binary signals proportional to the selected pairs of the seven multi-tone frequencies. These signals are scaled with selected binary output signals generated by a free-running pattern generator and representing slopes at various points on a sine wave to produce a binary signal stream that is applied to a controlled charge digital-to-analog conversion circuit that partially charges or discharges a capacitor in accordance with the binary 1's and 0's to produce an output waveform across the capacitor that corresponds to the combined pair of selected individual tone frequency sinusoids.

12 Claims, 10 Drawing Figures

DIGITALLY SYNTHESIZED MULTI-FREQUENCY SIGNAL GENERATOR

BACKGROUND OF THE INVENTION

The so-called Touch-Tone (trademark of American Telephone & Telegraph Company) systems that are presently in wide use for telephone "dialing" employ a three by four switching matrix for selecting a composite audio signal comprised of one of four lower band frequencies and one of three upper band frequencies coupled into the matrix. These seven frequencies are substantially sinusoidal waveforms generated by hand-wired conventional audio oscillators that are generally housed within the telephone unit. While the existing Touch-Tone systems operate exceptionally well when properly adjusted, they are subject to becoming detuned by shock or vibration, thereby resulting in erroneous dialing. Furthermore, because the existing Touch-Tone generators are fabricated on an assembly line and because of the continued increase in labor costs, the Touch-Tone system costs are relatively high and steadily increasing.

The tone generator of the present invention is a solid state integrated circuit device capable of being packaged in the small IC package and at a unit cost that decreases as production increases. Because the generator is a solid state device, it is rugged and stable so that the frequencies will not vary with the shock or vibration and, further, in the event of damage or destruction of the circuit, it is very easily and readily replaced in the field.

BRIEF DESCRIPTION

Briefly described, the invention comprises solid state digital circuitry that develops an audio output signal formed by a controlled charge digital-to-analog converter circuit which receives a binary pulse train representing the combination of selected upper and lower frequency audio signals such as generated in a telephone Touch-Tone system. All binary signals in the circuitry originate from a stable crystal-controlled oscillator producing high frequency signals that are suitably divided down to the desired pulse frequencies, which are then used to select appropriate output pulse trains generated by a free-running digital pattern generator which is continuously producing seven output pulse trains representing the slopes at seven equally spaced points in a quarter wave sinusoid. The selected pulse trains are then pulse width modulated to adjust the proper slope for each of the upper and lower frequencies and the output upper and lower bit streams are combined in an assembling circuit into the final pulse train for application to the digital-to-analog converter.

DESCRIPTION OF THE DRAWINGS

In the drawings which illustrate a preferred embodiment of the invention.

DETAILED DESCRIPTION OF THE PREFERRED EMBODIMENT

The principle of operation of the invention is to generate digital signals representing the seven audio frequencies used in Touch-Tone telephone systems, mix pairs of signals as selected by an external 2 of 7 telephone keyboard matrix, and convert the resulting digital bit stream into corresponding analog audio signals.

A typical Touch-Tone keyboard contains twelve keys arranged in a 3 by 4 matrix. Depressing a key generates an output signal formed by the combination of two of seven different audio frequencies that are generated locally by a suitable generator within the telephone desk or wall unit. The seven frequencies are divided into a lower group containing the frequencies: 697 Hz, 770 Hz, 852 Hz, and 941 Hz; and an upper group having the frequencies of: 1209 Hz, 1336 Hz, and 1447 Hz.

Figure 1:
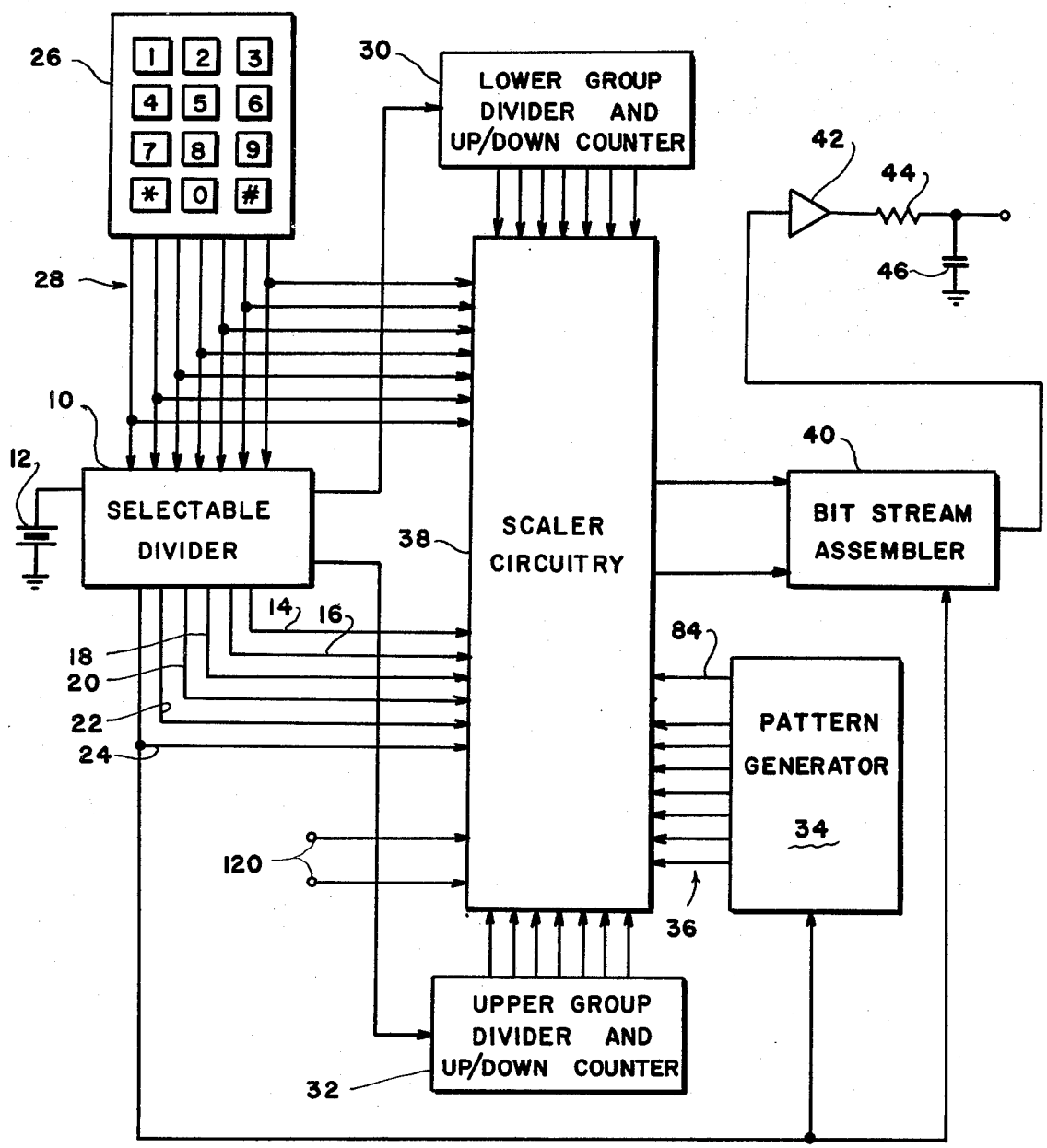
FIG. 1 is a block diagram illustrating the arrangement of various components in the circuitry of the invention.

Referring now to the schematic diagram of FIG. 1, digital signals proportional to the seven tone frequencies are generated by a selectable divider 10 clocked by a standard 3.58 MHz crystal 12. Crystal 12 is a standard item utilized by commercial television and provides long-term frequency stability at low price. As will subsequently be described in more detail, divider 10 continuously generates, during operation, various clock output signals on conductors 14–24. Upon depression of a key in the keyboard 26, D.C. signals will be transmitted through two of the seven conductors 28 to the divider, which will thereupon transmit a lower frequency clock signal proportional to the selected lower group frequency to a lower group divider and up/down counter 30 and an upper frequency clock signal proportional to the selected upper group frequency to the upper group divider and up/down counter 32. For reasons that will be subsequently described in detail, the digital pulse trains applied to counters 30 and 32 are twenty-eight times the lower group frequency and upper group frequency selected by the depression of the key in the keyboard 26.

Divider 10 must provide binary output signals to the counters 30 and 32 that are twenty-eight times the frequency of each of the seven individual Touch-Tone frequencies identified above. To obtain these particular frequencies, the divider 10 must divide the 3.58 MHz basic frequency of crystal 12 by the following values: 184, 166, 150, and 136 to obtain signals that are twenty-eight times the lower band frequencies; and by the values 106, 96, and 88 to obtain signals equal to twenty-eight times the upper band frequencies.

Operating at a clock frequency of one-tenth the frequency of crystal 12 is a pattern generator 34. Pattern generator 34 is a free-running counter that generates seven fixed binary pattern bit streams from its seven output conductors 36. As will subsequently be described in detail, each of the seven bit streams generated by the pattern generator 34 represents a particular slope on a sine wave.

Binary signals representing the seven slopes produced by the pattern generator 34, the six clock frequencies produced by the selectable divider 10, and a pair of D.C. signals emanating from the keyboard 26 are applied to scaler circuitry 38. Also applied to scaler circuitry 38 are the seven output signals from each of the dividers and up/down counters 30 and 32. As will be subsequently described in detail, the counters 30 and 32 identify each of seven equally spaced locations on one-quarter of a sine wave and, in operation, each of the seven output signals from the counters 30 and 32 select a particular slope pattern from the seven outputs of the pattern generator 34. The six clock signals generated by the divider 10 and entering the scaler 38 through conductors 14–24 are decoded within the scaler circuitry 38 to produce ten degrees of modulation, the appropriate ones of which are selected by the D.C. signals from keyboard 26 that enter the scaler circuitry 38 through conductors 28. The scaler circuitry 38 thereupon pulse width modulates each bit of the selected bit trains of pattern generator 34 to obtain for each of the seven different slope positions in the quarter wave a new slope that is corrected to account for frequency.

Scaler circuitry 38 actually contains two identical scalers and pulse width modulators, one operating upon the selected frequency in the lower frequency group and one operating on the selected frequency from the upper group. After the pulse width modulation step, the two bit streams representing these two selected frequencies are applied to a bit stream assembler 40 which combines the two binary signals into a single pulse train representing the combined frequencies. These are applied through suitable amplifier 42 and thence to the controlled charge digital-to-analog converter comprising a series resistance 44 followed by a grounded capacitor 46.

DIGITAL-TO-ANALOG CONVERTER

Figure 2:
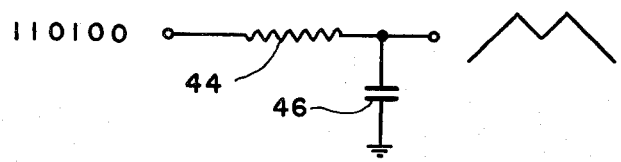
FIG. 2 is a schematic diagram of the controlled charge digital-to-analog converter circuit and the principle of operation.

FIG. 2 is a simple circuit diagram illustrating the controlled charge digital-to-analog converter. Controlled charge is the selective charging or discharging of a capacitor in such a way that the resultant voltage on the capacitor corresponds to the desired voltage. This is done by merely driving a two-valued or binary signal through an RC network, such as that illustrated in FIG. 2. The relationship between the time that the two-valued state is positive versus the time it is negative determines the resultant voltage. For example, if, in twenty time units there were ten positive or charging increments and ten negative or discharging increments, the resulting difference between beginning and end would be zero. If, however, during those same twenty time units there were fifteen charging bits, designated herein as binary 1's, and only five binary 0's or discharging bits, the resulting amplitude would be ten units higher than the original amplitude. Thus, by controlling the relationship between charging and discharging bits, the 1's and 0's, both the final amplitudes and the rate of change of amplitudes can be controlled. As shown in FIG. 2, a binary input signal of 110100 produces an output waveform 48 that rises for two units, drops for one, rises for one, then drops for two.

Figure 3:
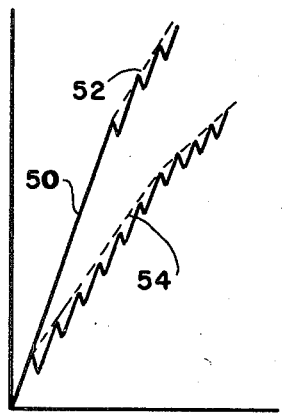
FIG. 3 is a waveform diagram illustrating the method of constructing a synthesized sinusoid from the converter of FIG. 2.

As illustrated in FIG. 3, a continuous string of binary 1's may be used to produce a constant segment 50 having a fixed or constant slope. The introduction of binary 0's into the input signal produces a sawtooth effect as illustrated by the reference numeral 52 and will produce a resultant segment having less slope, as best illustrated by the waveform 54.

Figure 4:
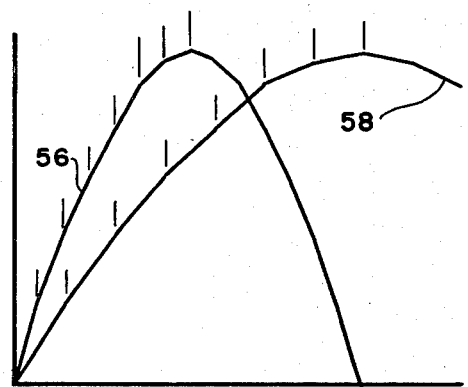
FIG. 4 is a waveform diagram illustrating a portion of a waveform made up of a plurality of the segments illustrated in FIG. 3.

As illustrated in FIG. 4, a sine wave may be developed by a plurality of straight line segments, each having an appropriate slope, either positive or negative, and with each straight line segment actually being the resultant of a sawtooth segment, such as segment 54 of FIG. 1. The sine wave may be of a relatively high frequency, such as the waveform 56, or by suitably reducing the slope in each segment, a lower frequency waveform 58 may be generated. In FIG. 4, the frequency of the waveform 56 appears to be approximately twice that of waveform 58. Both of these waveforms are readily developed by the application of appropriate binary bit trains to the input of the digital-to-analog converter illustrated in FIG. 2.

DIVIDER AND UP/DOWN COUNTER

Figure 5:
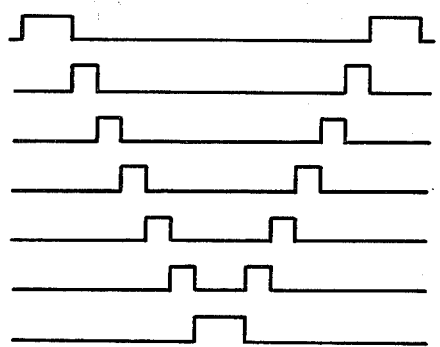
FIG. 5 is a waveform diagram illustrating typical output signals generated by the up/down counters illustrated in FIG. 1.

As illustrated in FIG. 4, the slopes of each of the waveforms 56 and 58 are varied at points representing one-seventh of each quarter wave point, or at each 12.86° in time. The changes occurring at each one-seventh of each quarter wave of the high frequency waveform 56 is less than that of the corresponding point on the lower frequency waveform 58. Because there is a different slope for each segment in each waveform, the waveform generation circuitry must identify each segment and there must be a signal indicating which segment is present for each of the frequencies in the upper and lower bands. These signals are generated by the up/down counters 30 and 32. As previously indicated, counters 30 and 32 receive binary clocking signals from the divider 10 that are twenty-eight times the particular frequencies selected by the keyboard 26. Each of the counters 30 and 32 divide that particular input clocking frequency by seven to represent each of the seven segments in the quarter-wave and generate seven output pulse patterns as indicated in FIG. 5. Each of these appropriately timed pulses are used to select a slope for use at each one-seventh point in the quarter wave to be developed, or a total of twenty-eight slopes in a complete cycle.

PATTERN GENERATOR 34

Figure 6:
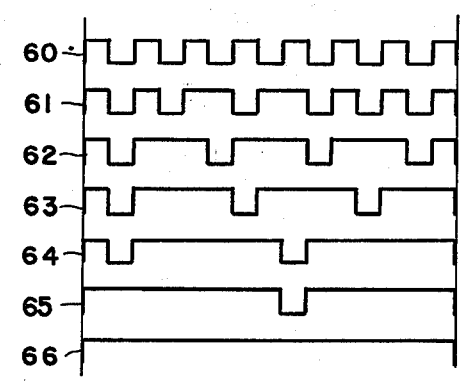
FIG. 6 is a waveform diagram illustrating the seven bit streams produced by the pattern generator of FIG. 1.

The pattern generator 34 of FIG. 1 is coupled via conductor 24 to divider 10 to receive an assembly clock signal operating at one-tenth the crystal frequency or 358 KHz. This clock signal is divided by 2 in the pattern generator to produce a pattern generator clock operating at 179 KHz which operates the free-running counter of the generator. Generator 34 produces on seven output conductors 36 a continuously repeating output of seven binary bit streams 60–66 as illustrated in FIG. 6. Each of the seven bit streams represent a slope on the highest frequency sine wave to be developed by the circuitry. As illustrated in FIG. 6, the output pulse train 66 comprises fifteen bits of binary 1's which, when applied to the controlled charge digital-to-analog converters 44 and 56, will produce the steepest slope. On the other hand, the output bit stream 60 of FIG. 6 contains an equal number of 1's and 0's and will produce an output waveform with a zero slope.

SELECTABLE DIVIDER 10

Figure 7:
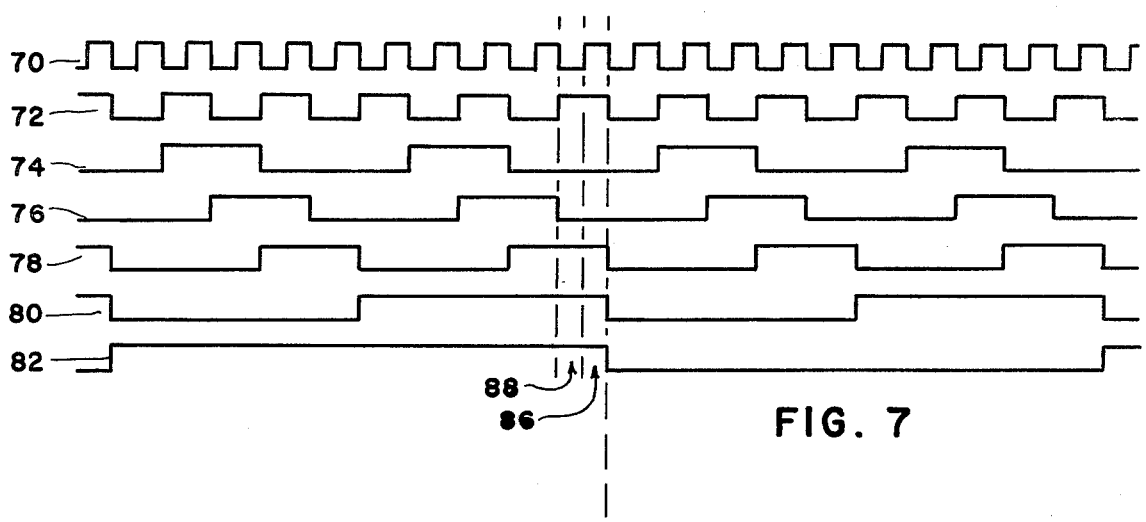
FIG. 7 is a waveform diagram illustrating the various clock signals generated in the circuitry of FIG. 1.

As previously discussed, the divider 10 receives a 3.58 MHz signal from crystal 12 and suitably divides that frequency to obtain output signals to counters 30 and 32 that are twenty-eight times the frequency selected by the external keyboard 26. Divider 10 also generates clock frequencies for operation of scaler circuitry 38. As illustrated in FIG. 7, divider 10 outputs to scaler 38 the pulse train 70, which is the actual crystal frequency of 3.58 MHz. A second clock frequency 72 of 1.79 MHz is also applied by the divider to the scaler circuit 38. Clocks 74, 76 and 78 are scaler clocks having a frequency of one-fifth the crystal frequency and a 40/60 duty cycle. The scaler clock 76 is time-delayed one crystal cycle from clock 74 and clock 78 is delayed the same amount from clock 76. Divider 10 also generates an assembly clock 80, which is a 50% duty cycle clock operating at one-tenth the crystal frequency of 358 KHz. An additional clock signal 82 of FIG. 7 is a pattern generator clock that is developed in the pattern generator 34 at half the frequency of the assembly clock 80 and is introduced into the scaler circuitry 38 through conductor 84.

SCALER CIRCUITRY 38

As previously mentioned, the seven output pulse trains of pattern generator 34 represent slopes at seven equally spaced points in each quarter wave of the highest frequency to be developed. The seven slope patterns represent positive slopes; the corresponding negative slopes are obtained by merely selecting the inverted values of the pulse trains. Keyboard 26 selects two of seven different frequencies; therefore, there are a total of forty-nine different slopes required for seven frequencies. It is possible to generate forty-nine slopes in a pattern generator such as generator 34. However, it is simpler and more efficient to use the signals representing the seven highest frequency slopes from generator 34 and to scale down those slopes as required by the remaining six lower frequency Touch-Tone frequencies. This is the function of the scaler circuitry 38.

Referring again to the clock signals of FIG. 7, it will be noted that during one complete cycle of the pattern generator clock 82, there are no duplicated binary patterns in the combination of all clocks 70 through 82. Thus, the binary number corresponding to the reference numeral 86 may be read as: 1110011, while its next adjacent binary number 88 may be read as: 1110010. Within the scaler circuitry 38 is a decoding network that decodes the pulse patterns 70 through 82 and produces outputs as shown in FIG. 8 of the drawings.

Figure 8:
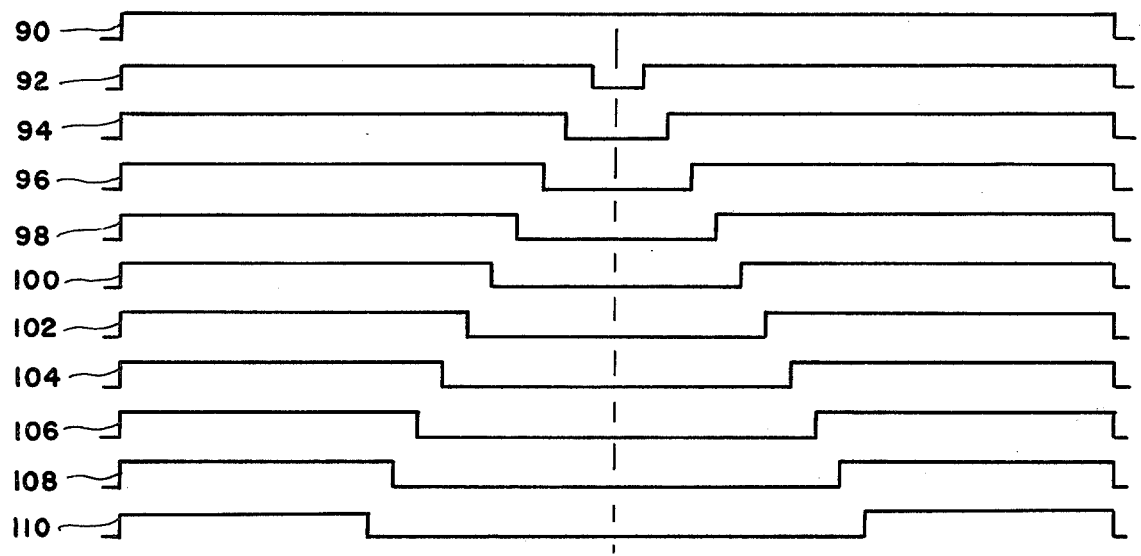
FIG. 8 is a waveform diagram illustrating various degrees of pulse width modulation signals generated in the scalers of FIG. 1.

The pulse trains of FIG. 8 represent various percentages of modulation which is to be applied by a pulse width modulator circuit within the scaler circuitry 38 to each of the positive and negative bits in the selected slope bit stream of pattern generator 34 and as illustrated in FIG. 6. Thus, in FIG. 8 the modulation pattern 90 represents 100% modulation, pattern 92 represents 90%, pattern 94 represents 80%, and so on down to modulation pattern 110, which represents 0% since it has an equal number of 1's and 0's to represent a horizontal segment as discussed in connection with FIG. 2. It is apparent that the 100% modulation pattern 90 is not necessary and therefore not used in the circuitry because the signals developed by the pattern generator 34 already represent the slope for the highest frequency signal to be generated. Each of the modulation patterns 92-100 are available for selection by the output signals from the keyboard 26. Thus, if the highest frequency is selected by the keyboard, the upper group divider and up/down counter 32 will select the appropriate seven slopes to be applied at each of the seven points in the quarter wave to be developed, such as waveform 56 of FIG. 4. On the other hand, when the keyboard 26 selects a low frequency, such as waveform 58 that is half of the frequency of waveform 56 of FIG. 4, the lower group divider and up/down counter 30 will, at the appropriate times during the seven parts of the quarter waveform, select the same seven slope outputs from pattern generator 34 but will pulse width modulate each pulse in the slope pulse pattern to derive the reduced slopes necessary for the development of the waveform 58.

Figure 9:
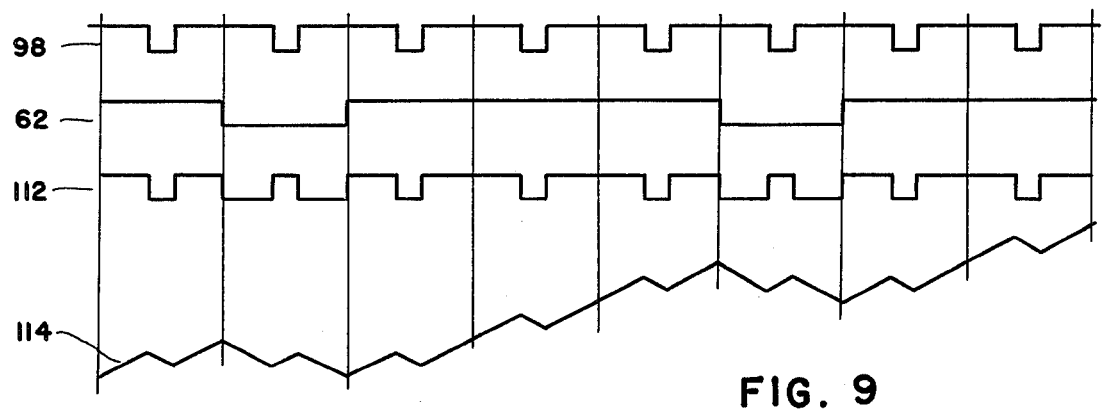
FIG. 9 is a waveform diagram illustrating an example of the pulse width modulation of pattern generator bits and the resulting analog waveform.

FIG. 9 illustrates the operation of the pulse width modulator. In FIG. 9, it is assumed that the counter 30 or 32 has selected a particular slope pulse pattern from pattern generator 34, such as pattern 62 of FIG. 6. Pattern 62 contains the fifteen bits, 101110111011101, after which it repeats. Pattern 62 of FIG. 6 is illustrated in FIG. 9 on an expanded scale. Each bit in pattern 62 will be pulse width modulated by a modulation pattern suitable for the particular frequency selected, such as the 60% pattern of FIG. 4. The rule to be followed during the pulse width modulation process is: Copy the modulation pattern 98 when the pattern generator pulse 62 is a binary "1"; reverse the modulation pattern 98 when the pattern generator pulse 62 is a "0". Following the rule produces the output pulse train 112 which, if applied directly to the controlled charge digital-to-analog converter, would produce an output waveform similar to waveform 114 of FIG. 9. It will be noted in waveform 114 that all positive going and negative going segments are of identical slope and that the overall curve slope is dependent upon the pulse width modulated pattern generator pulse train.

In the selection of the appropriate modulation patterns 92-110 of FIG. 8, the circuitry may be adjusted to give consideration to frequency pre-emphasis. It is desired that the selected individual frequencies be received at equal amplitudes throughout a telephone line. The pre-emphasis corrects amplitudes of the generated frequencies to match the expected line characteristics by the appropriate selection of the modulation to be applied.

An additional amplitude consideration may be identified as the available loop current. The closer a telephone is located to the central office, the lower the line resistance and consequently the higher the loop current and signal loss from the generator to the receiver. The output amplitudes may be scaled as needed by changing the applied pulse width modulation factor by a constant value to all seven frequencies by the application of a suitable signal to the loop current terminals 120 of FIG. 1.

BIT STREAM ASSEMBLER 40

Figure 10:
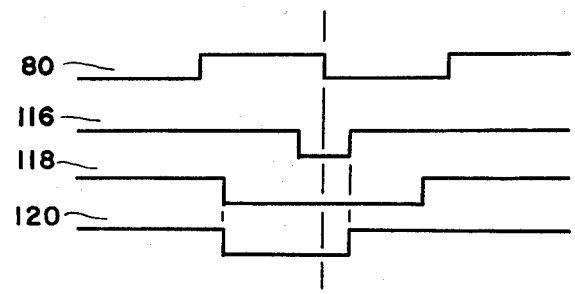
FIG. 10 is a waveform diagram illustrating the multiplexing action for combining an upper and a lower frequency in the bit stream assembler of FIG. 1.

Scaler circuitry 38 pulse width modulates the selected frequencies from the upper and lower frequency groups as required by the frequency selection of keyboard 26. The output patterns, such as pattern 112 of FIG. 9, are then applied to a bit stream assembler 40 which, operating in accordance with the assembler clock signal 80 of FIG. 7, multiplexes the binary bit streams representing the selected upper and lower frequencies as illustrated in FIG. 10. As shown in FIG. 10, the fixed frequency assembler clock 80 at a frequency of 358 KHz at a 50% duty cycle synchronized with the pattern generator frequency, receives the bit stream pattern 116 which may emanate from the upper group scaler, and a second input 118, which may be generated by the lower group scaler. At the end of each pulse of the scaler clock 80, the multiplexing circuitry of the assembler 40 changes so that it will output a pulse train containing the binary bit stream of one-half the bits representing one frequency followed by one-half the bits representing the other selected frequency. Thus, as shown in FIG. 10, the bit stream 118 is contained in the output bit stream 120 up to the bit center line corresponding to the end of clock pulse 80, after which the bit stream of 116 is applied to the output. By locating the pulse width modulation at the center of the pattern generated bit, the desired modulation result is achieved for both waveforms. Thus, the 50/50 multiplexing has the effect of generating a combined bit train representing the combination of the two selected frequencies and the output waveform from the controlled charge circuit comprising resistor 44 and capacitor 46 will reproduce the combined output waveform similar to the waveform produced by the combination of two audio sine wave frequencies.

What is claimed is:

1. A signal synthesizer for producing a sine wave signal from a binary signal source, said synthesizer including:
    a controlled charge digital-to-analog converter;
    slope pattern generating means coupled to the input of said converter for generating a plurality of binary pulse trains, each of said plurality comprising converter charging and discharging binary bits representing the slope at a predetermined one of a plurality of equally spaced points on a sine wave; and
    clock responsive selection circuitry coupled to said generating means for selecting appropriate ones of said plurality of pulse trains in response to a frequency clock binary input signal, said clock responsive selection circuitry including scaler circuitry for synthesizing sine waves of differing slopes and frequencies by attenuating the charge and discharge rates of said slope pattern charging and discharging binary bits through pulse-width-modulating each of said charging and discharging binary bits.

2. The synthesizer claimed in claim 1 further including frequency selecting means coupled to said scaler circuitry, said selecting means including circuitry for generating signals for determining the degree of pulse width modulation to be applied by said scaler circuitry to said binary bits.

3. The synthesizer claimed in claim 2 further including fixed frequency generating and dividing circuitry for generating a fixed frequency and for dividing said frequency into a plurality of fixed binary clocking frequencies, said generating and dividing circuitry being coupled to and responsive to a frequency selected by said frequency selecting means for producing and applying to said scaler circuitry a frequency clock binary input signal proportional to the frequency of the desired synthesized sine wave output.

4. The synthesizer claimed in claim 3 wherein said frequency selection means includes means for the simultaneous selection of a first and a second frequency to be combined by said synthesizer to produce a combined pair of output sine waves, and wherein said fixed frequency generating circuitry produces, in response to said simultaneous selection, first and second frequency clock binary input signals for said scaler circuitry.

5. An audio frequency signal synthesizer for producing signals corresponding to the combination of a pair of sine waves of different audio frequencies, said synthesizer comprising:
    frequency selection means for producing first and second electrical output signals representing selected first and second audio frequencies, respectively;
    a fixed frequency signal generator;
    frequency divider circuitry coupled to said frequency selection means and to said signal generator for dividing the signal of said generator into a plurality of fixed frequency binary clock signals, and into first and second frequency binary clock signals proportional to said selected first and second audio frequencies, respectively;
    first and second divider circuits coupled to receive said first and second frequency binary clock signals, respectively, each of said divider circuits comprising circuitry for dividing its respective binary clock signal by a predetermined integer equal to the number of preselected points on each quarter of a synthesized sine wave at which point the sine wave slope is to be altered by the synthesizer circuitry;
    a pattern generator operating in response to one of said fixed frequency binary clock signals produced by said frequency divider circuitry for generating a plurality of output binary pulse trains, said plurality corresponding to said number of preselected points on each quarter sine wave, and each of said plurality representing the slope at its respective preselected point on the quarter sine wave of the highest frequency to be synthesized;
    scaler circuitry coupled to said first and second divider circuitry, said pattern generator, said frequency selection means and said frequency divider circuitry, said scaler circuitry including means for the selection of said pattern generator output binary pulse trains by each output signal from said first and second divider circuits, and said scaler circuitry including means for pulse width modulating each bit in each of said selected pattern generator output binary pulse trains by degrees determined by said frequency selection means, and for producing first and second pulse width modulated binary signals representing slopes at preselected points on said respective first and second sine waves;
    a bit stream assembler coupled to receive said first and second pulse width modulated signals and to combine said first and second signals into a single binary pulse stream representing a combination of said first and second sine waves; and
    an analog-to-digital converter coupled to receive said single binary pulse stream and produce an output waveform that varies in amplitude in accordance with the quantity of binary 1's and 0's in said pulse stream.

6. The synthesizer claimed in claim 5 wherein said analog-to-digital converter is a controlled charge device including a capacitor which is selectively charged and discharged by the application of respective positive and negative binary bits.

7. The synthesizer claimed in claim 6 wherein said frequency divider circuitry produces first and second frequency binary clock signals that are twenty-eight times said selected first and second audio signals, and wherein said first and second divider circuits divide their respective binary clock signals by the integer of seven to represent a corresponding seven equally spaced divisions of 90° of a sine wave.

8. The synthesizer claimed in claim 7 wherein said first and second divider circuits include step counters.

9. The synthesizer claimed in claim 8 wherein said pattern generator includes free-running counters operating at one of said fixed frequency binary clock signals and generates seven different output pulse trains representing the slopes at said seven equally spaced divisions.

10. The synthesizer claimed in claim 9 wherein said scaler circuitry generates at least seven degrees of modulation for pulse width modulating said pulse trains of said pattern generator, said degrees of modulation being generated by the decoding of said fixed frequency binary clock signals generated by said frequency divider circuitry.

11. The synthesizer claimed in claim 10 wherein said fixed frequency signal generator is controlled by a 3.58 MHz crystal.

12. The synthesizer claimed in claim 11 wherein said frequency selection means comprises a multi-tone telephone matrix wherein twelve manually operated keys select two of seven audio frequencies.

* * * * *